US007887977B2

(12) United States Patent  (10) Patent No.: US 7,887,977 B2
Sugimoto                     (45) Date of Patent:    Feb. 15, 2011

(54) EXPOSURE MASK, ITS MANUFACTURE METHOD, PATTERN TRANSFER METHOD, PATTERN FORMING METHOD, AND SRAM MANUFACTURE METHOD

(75) Inventor: Fumitoshi Sugimoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 148 days.

(21) Appl. No.: 12/068,694

(22) Filed: Feb. 11, 2008

(65) Prior Publication Data

US 2008/0138722 A1 Jun. 12, 2008

Related U.S. Application Data

(63) Continuation of application No. PCT/JP2005/014746, filed on Aug. 11, 2005.

(51) Int. Cl.
*G03F 1/00* (2006.01)
(52) U.S. Cl. .............................. 430/5; 430/311; 430/394
(58) Field of Classification Search .................. 430/5, 430/311, 394; 716/19, 21
See application file for complete search history.

(56) References Cited

U.S. PATENT DOCUMENTS

| 5,989,756 | A * | 11/1999 | Nakae | ............................. 430/5 |
| 2004/0029023 | A1 | 2/2004 | Misaka | |
| 2007/0065730 | A1 | 3/2007 | Misaka | |
| 2008/0032208 | A1 * | 2/2008 | Kim et al. | ...................... 430/5 |

FOREIGN PATENT DOCUMENTS

| EP | 1365288 A1 | 4/2002 |
| JP | 07-248612 A | 9/1995 |
| JP | 07-301908 A | 11/1995 |
| JP | 11-109603 A | 4/1999 |
| JP | 2003-021891 A | 1/2003 |
| JP | 2004-302263 A | 10/2004 |
| WO | 02/091079 A1 | 11/2002 |
| WO | WO 2005/040919 A1 | 5/2005 |

OTHER PUBLICATIONS

International Search Report of PCT/JP2005/014746, date of mailing Nov. 15, 2005.
Japanese Office Action dated Apr. 7, 2009, issued in corresponding Japanese Patent Application No. 2007-529444.

* cited by examiner

*Primary Examiner*—Stephen Rosasco
*Assistant Examiner*—Rashid Alam
(74) *Attorney, Agent, or Firm*—Fujitsu Patent Center

(57) ABSTRACT

A mask formed with a mask pattern is prepared, the mask pattern having a shape that a base pattern is divided into at least two partial patterns disposed at a space narrower than a resolution limit. A first relation is acquired between a width of the space separating the partial patterns and a size of a pattern on a substrate formed by transferring the mask pattern. The width of the space separating the partial patterns is determined in accordance with the size of a pattern to be formed on the substrate and the first relation. A mask pattern is formed having at least two separated partial patterns on a mask in accordance with the determined width of the space.

16 Claims, 8 Drawing Sheets

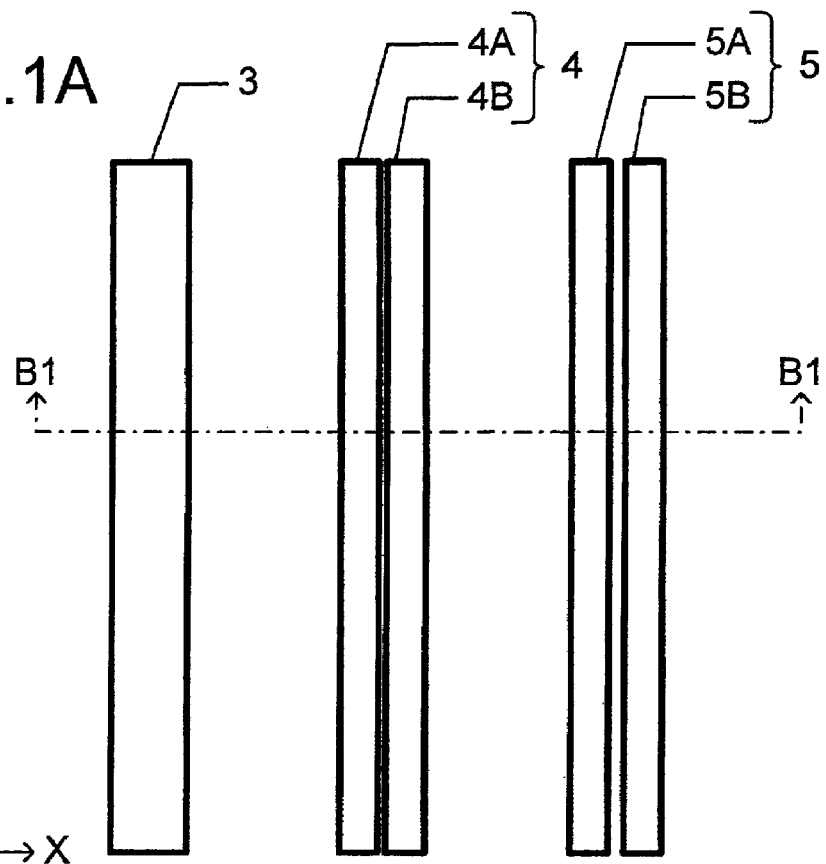
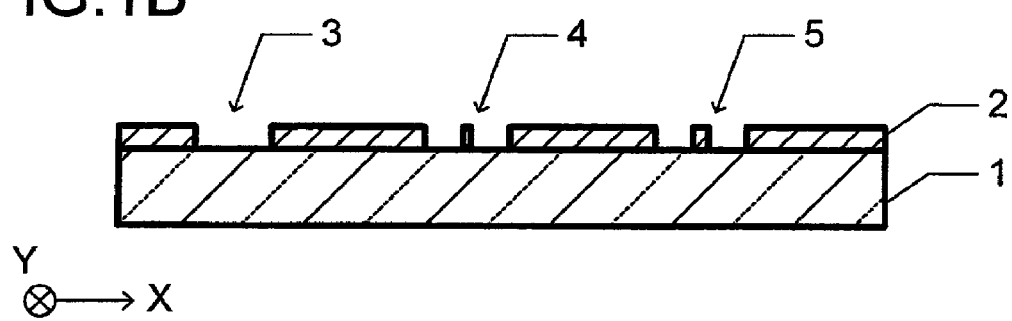

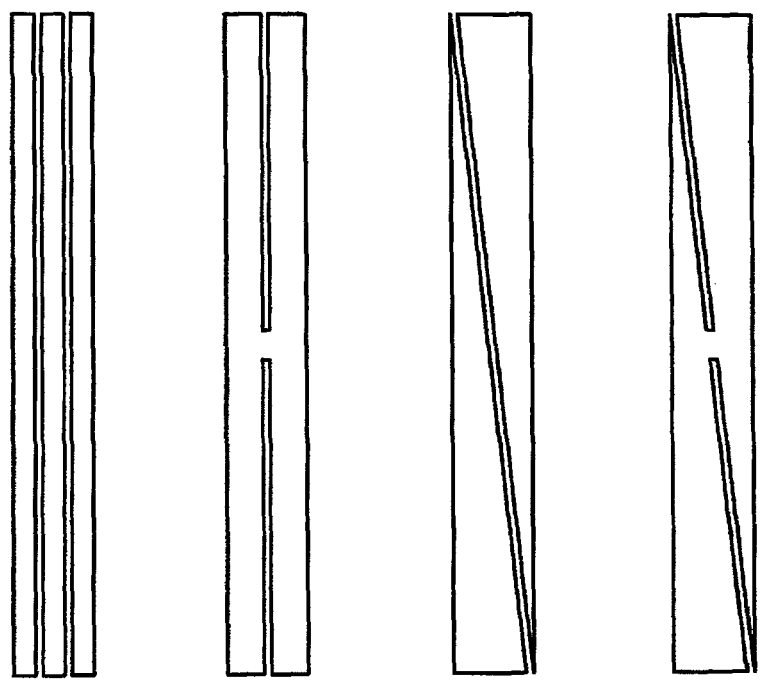
FIG.5A  FIG.5B  FIG.5C  FIG.5D
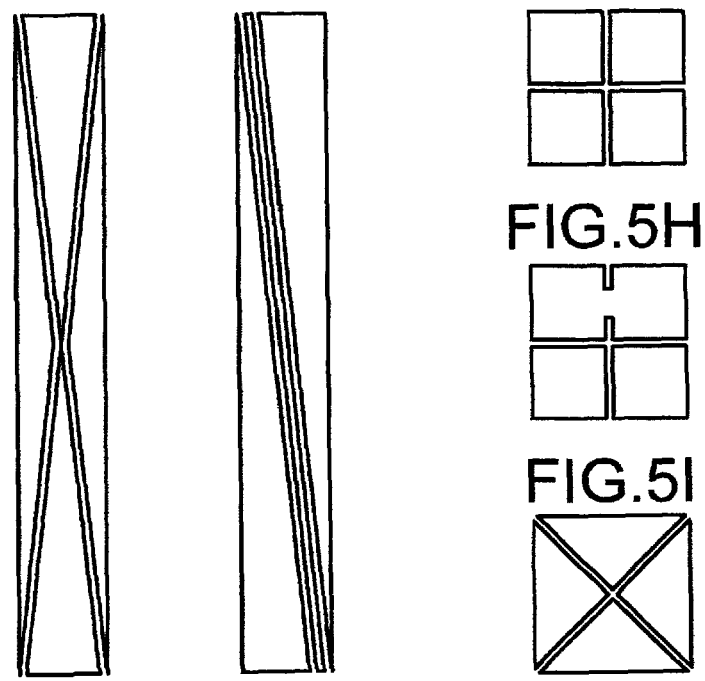
FIG.5E  FIG.5F  FIG.5G
FIG.5H
FIG.5I FIG.6A
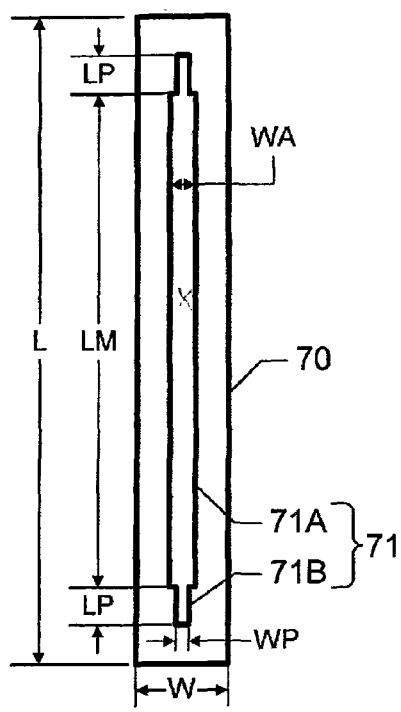
FIG.6B
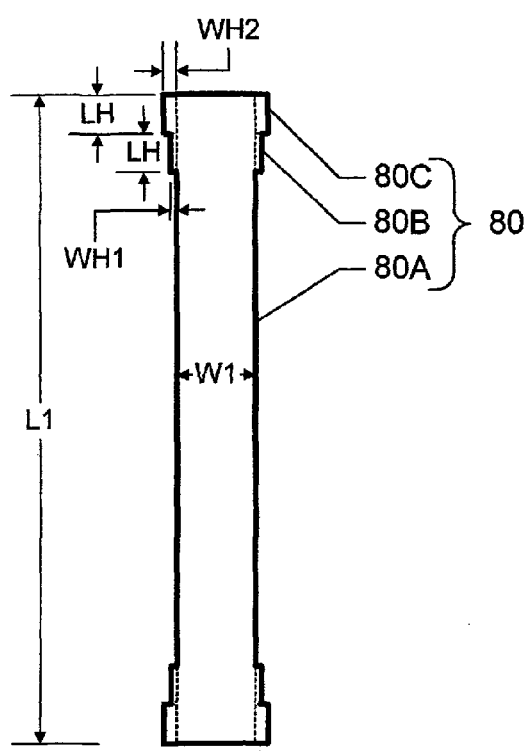
FIG.6C
FIG.6D

EXPOSURE MASK, ITS MANUFACTURE METHOD, PATTERN TRANSFER METHOD, PATTERN FORMING METHOD, AND SRAM MANUFACTURE METHOD

CROSS REFERENCE TO RELATED APPLICATION

This application is based on PCT/JP2005/14746, filed on Aug. 11, 2005, the entire contents of which are incorporated herein by reference.

TECHNICAL FIELD

The present invention relates to an exposure mask, its manufacture method, a pattern transfer method, a pattern forming method and an SRAM manufacture method, and more particularly to an exposure mask used in a photolithography process that is one of semiconductor manufacture processes, its manufacture method, a pattern transfer method, a pattern forming method and an SRAM manufacture method.

BACKGROUND ART

A width of a pattern such as a wiring to be formed on a semiconductor substrate is recently becoming narrower in order to meet the requirements of high speed and high density of semiconductor devices. Miniaturization of patterns is realized by shortening the wavelength of exposure light used in photolithography. Presently, the pattern rule of semiconductor devices is at the level of 100 nm or narrower. This size is shorter than the wavelength of exposure light. For example, ArF excimer laser used as an exposure light source has a wavelength of 193 nm.

Since a width of the pattern rule is shorter than the wavelength of exposure light, influence of the optical proximity effect by diffraction and the like cannot be neglected, and pattern deformation by the optical proximity effect is now conspicuous. There occurs a phenomenon that even if the line widths of patterns on a mask are the same, line widths transferred to a wafer are different depending upon a pattern distribution density.

The following patent Document 1 discloses the technique of correcting a variation in the line widths caused by a pattern distribution density. Patterns on a mask disclosed in patent Document 1 will be described.

In an area where light shielding patterns are disposed densely, a slit is formed in each light shielding pattern. In an area where light shielding patterns are disposed coarsely, a slit is not formed in each light shielding pattern. Since light is transmitted through the slit, optical densities in the dense and coarse light shielding areas can be made uniform. By making uniform the optical densities, it becomes possible to prevent patterns from being deformed by the optical proximity effect.

The shape of an end portion of a pattern is likely to be deformed by the optical proximity effect. If a line width in particular becomes narrow, it is conspicuous that opposite ends of a straight line pattern retreat and the straight line becomes short. This phenomenon is called "shortening". A correction method called an optical proximity correction (OPC) has been proposed as a method of correcting a shape difference to be caused by the optical proximity effect between a mask pattern and a transferred pattern. The OPC method corrects a change in the size and shape of a transferred pattern, by partially broadening the mask pattern in advance toward a direction opposite to a direction of the pattern deformation when the mask pattern is transferred to the wafer, or by disposing a dummy pattern.

The following patent Documents 2 and 3 disclose the techniques of suppressing shortening by utilizing the OPC. For example, a pattern is designed to make end portions of an elongated mask pattern broader than a central portion of the pattern. This broadened portion is called a hammer head. By forming the hammer head to the opposite ends of an elongated mask pattern, shortening can be suppressed.

Patent Document 1: JP-A-2005-10635
Patent Document 2: JP-A-2004-302263
Patent Document 3: Specification of JP-2004-196963 (JP-A-2006-19577)

DISCLOSURE OF THE INVENTION

According to one aspect of an embodiment, there is provided a manufacture method for an exposure mask, including: (a) forming a mask pattern having a shape that a base pattern is divided into at least two partial patterns disposed at a space narrower than a resolution limit, and acquiring a first relation between a width of the space separating the partial patterns and a size of a pattern on a substrate formed by transferring the mask pattern; (b) determining the width of the space separating the partial patterns in accordance with the size of a pattern to be formed on the substrate and the first relation; and (c) forming a mask pattern having at least two separated partial patterns on a mask in accordance with the width of the space determined at the step (b).

According to another aspect of an embodiment, there is provided an exposure mask including: a mask substrate; and a mask pattern formed on the mask substrate, wherein the mask pattern includes at least two partial patterns corresponding to a pattern to be transferred to a substrate and separated from each other at a space narrower than a resolution limit.

According to another aspect of an embodiment, there is provided a pattern transfer method including: (a) exposing a photosensitive film through an exposure mask having a mask pattern of a shape that a base pattern is divided in a first direction into at least two partial patterns disposed at a space narrower than a resolution limit; and (b) and developing the exposed photosensitive film to form a first pattern to which the mask pattern is transferred, wherein a size in the first direction of the first pattern is smaller than a size in the first direction of a second pattern formed by transferring the base pattern under a same exposure condition as a condition of the step (a).

According to another aspect of an embodiment, there is provided an exposure mask including: a mask substrate; and a mask pattern including therein an auxiliary pattern and formed on the mask substrate, wherein a light transmission rate of an area inside the mask pattern and outside the auxiliary pattern is lower or higher than both a light transmission rate of an area inside the auxiliary pattern and a light transmission rate of an area outside the mask pattern, an outer shape of the mask pattern is a polygon having the number of apexes smaller than the number of apexes of the auxiliary pattern, and a size of the auxiliary pattern is smaller than a resolution limit.

According to another aspect of an embodiment, there is provided a pattern transfer method including: exposing a photosensitive film through a mask pattern including therein an auxiliary pattern, wherein a light transmission rate of an area inside the mask pattern and outside the auxiliary pattern is lower or higher than both a light transmission rate of an area inside the auxiliary pattern and a light transmission rate of an area outside the mask pattern, an outer shape of the mask pattern is a polygon having the number of apexes smaller than the number of apexes of the auxiliary pattern, and a size of the auxiliary pattern is smaller than a resolution limit; and developing the exposed photosensitive film.

BRIEF DESCRIPTION OF THE DRAWINGS

FIGS. 1A and 1B are a plan view and a cross sectional view of mask patterns according to a first embodiment.

FIGS. 5A to 5I are plan views of mask patterns according to a modification of the first embodiment.

FIG. 6A is a plan view of a mask pattern of a second embodiment, FIG. 6B is a plan view of a conventional hammer head type mask pattern, and FIGS. 6C and 6D are plan views of the patterns formed by transferring the mask patterns shown in FIGS. 6A and 6B.

BEST MODES FOR CARRYING OUT THE INVENTION

Figure 2:
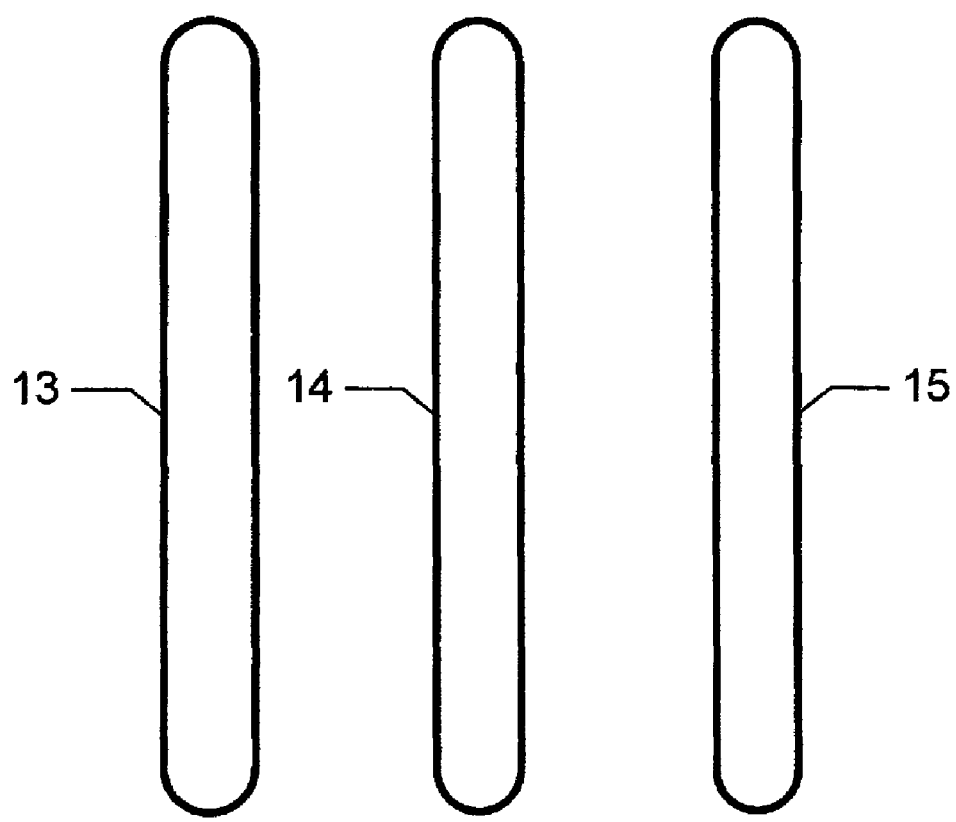
FIG. 2 is a plan view of patterns transferred from the mask patterns of the first embodiment.

Consider now the case in which by using ArF excimer laser and a phase shift mask, a straight line pattern having a width of 90 nm is transferred by reduction projection exposure. The size of a mask pattern formed on a mask is denoted as reduced value that is a size on a wafer with an involved reduction factor in this specification, unless otherwise specifically notified. For example, if a reduction factor is ¼, an actual width of a mask pattern corresponding to a straight line pattern having a width of 90 nm on a wafer is 360 nm. In this case, the width of the mask pattern is specified as 90 nm that is the reduced value.

FIG. 1A is a plan view of mask patterns according to the first embodiment, and FIG. 1B is a cross sectional view taken along one-dot chain line B1-B1 shown in FIG. 1A. On the surface of a glass substrate 1, a light shielding film 2 made of MoSi is formed. Mask patterns 3 to 5 are defined by openings formed through the light shielding film 2.

An ultraviolet ray having a wavelength of 193 nm and using ArF excimer laser as a light source transmits almost 100% through the inside of the mask patterns 3 to 5 (regions where the openings are formed). The ultraviolet ray transmits about 6% through the outside of the mask patterns 3 to 5 (region where the light shielding film 2 is formed). A thickness of the light shielding film 2 is set so that a phase of the ultraviolet ray transmitted through the region where the light shielding film 2 is formed is delayed by 180° from a phase of the ultraviolet ray transmitted through the regions where the openings are formed.

An XY orthogonal coordinate system is defined on the surface of the glass substrate 1. The mask pattern 3 has a rectangle shape long in the Y-direction. The mask pattern 4 has a shape that a base pattern having the same shape as that of the mask pattern 3 is divided into two partial patterns 4A and 4B disposed separated by a narrow space extending in the Y-direction. A distance between the partial patterns 4A and 4B is narrower than the resolution limit. A total width of the partial patterns is equal to the width of the base pattern.

The other mask pattern 5 is also constituted of two partial patterns 5A and 5B like the mask pattern 4. A distance between the partial patterns 5A and 5B is narrower than that between the partial patterns 4A and 4B of the mask pattern 4. The distance between the partial patterns 5A and 5B is also narrower than the resolution limit.

For example, the mask pattern 3 has a length of 1000 nm and a width of 90 nm. The partial pattern distances of the mask patterns 4 and 5 are 3 nm and 6 nm, respectively.

By using the mask shown in FIGS. 1A and 1B, a resist pattern was formed in a positive type chemically amplified resist film formed on a wafer, by reduction projection exposure at a reduction factor of ¼. A light source used is ArF excimer laser having a wavelength of 193 nm. A thickness of the resist film is 250 nm, and an antireflection film made of novolak resin and having a thickness of 80 nm is formed on the bottom surface of the resist film. Exposure was conducted under the condition that a pattern on a wafer obtained by transferring the mask pattern 3 having a line width of 90 nm had a width of just 90 nm. Hereinafter, the pattern on the wafer is denoted as a "transferred pattern".

FIG. 2 is a plan view of transferred patterns 13 to 15 formed on the wafer by the mask patterns 3 to 5. Since each of the distances between the partial patterns of the mask patterns 4 and 5 is narrower than the resolution limit, the corresponding transferred patterns 14 and 15 each will not be separated into two parts, but form one pattern. Both ends of the transferred patterns 13 to 15 have roundish shapes. Widths of the transferred patterns 13 to 15 were 90 nm, 88 nm, and 86 nm, respectively.

Figure 3:
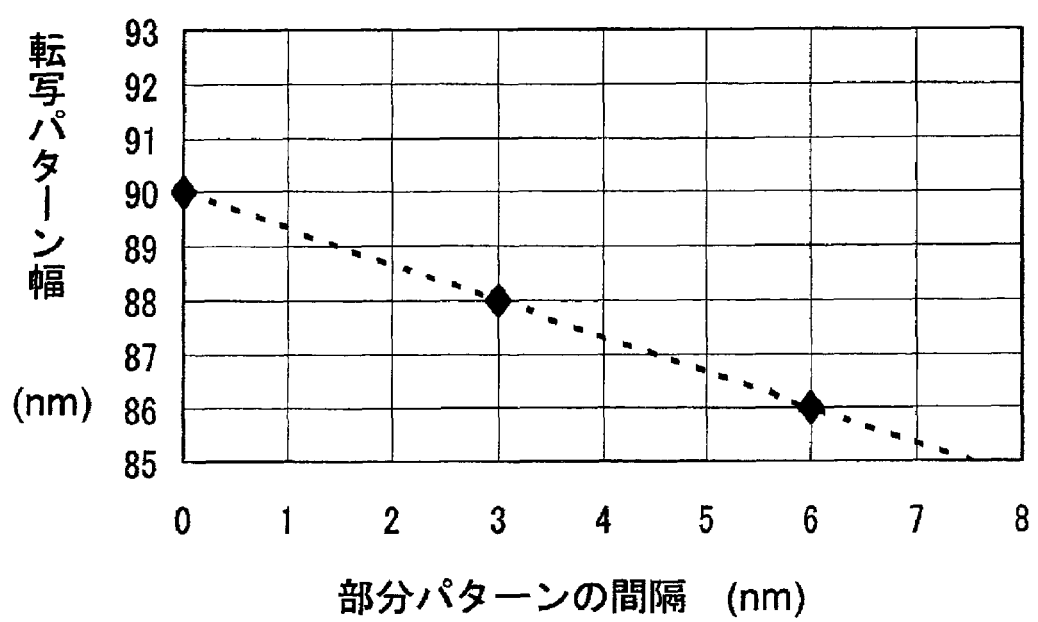
FIG. 3 is a graph showing a relation between a transferred pattern width and a distance between partial patterns constituting a mask pattern.

FIG. 3 shows the relation between a distance between partial patterns constituting a mask pattern and a width of a transferred pattern. The abscissa represents a distance between partial patterns in the unit of "nm", and the ordinate represents a width of a transferred pattern in the unit of "nm". It can be seen that as the distance between partial patterns becomes wider, the width of the transferred pattern becomes narrower. It can be considered that this tendency remains in the range that the distance between partial patterns is narrower than the resolution limit.

It can be understood that the width of the transferred pattern can be adjusted as desired in the range of 90 nm to 86 nm by adjusting the distance between partial patterns. A width of the transferred pattern formed through transfer of the mask pattern having a width of 89 nm was not 89 nm but 86 nm. The size of a mask pattern is adjusted generally in increases of 1 nm. Therefore, if one mask pattern such as the mask pattern 3 is used, a transferred pattern having a width wider than 86 nm and narrower than 90 nm cannot be formed.

By adopting the shape that a base pattern is separated into two partial patterns like the mask patterns 4 and 5 of the first embodiment, a width of a transferred pattern can be adjusted in increases of a value smaller than 4 nm.

If a width of a base pattern before being separated into partial patterns is made wider than 90 nm and a mask pattern is formed by separating the base pattern, a width of a transferred pattern can be adjusted in increases of a value smaller than 4 nm, even in the range wider than 90 nm. For example, if a width of a base pattern is set to 94 nm and a mask pattern that is obtained by separating the base pattern is used, a transferred pattern having an arbitrary width in a range between 90 nm and 94 nm can be formed.

Next, description will be made on a manufacture method for the exposure mask of the first embodiment. First, an evaluation mask is prepared. The evaluation mask has mask patterns each having a shape that a base pattern is separated into two partial patterns disposed separated by a space narrower than the resolution limit. The evaluation mask has a plurality of mask patterns having different distances between partial patterns.

A transferred pattern is formed on a wafer by using the evaluation mask, and a width of the transferred pattern is measured. From the measurement results, a relation is obtained between a distance between partial patterns constituting the mask pattern and a width of the transferred pattern formed by the mask pattern. This relation is called hereinafter a "first relation".

The size of a mask pattern is determined in accordance with a width of a transferred pattern to be formed on a wafer and the first relation. For example, if a width of a transferred pattern is 90 nm, a mask pattern having a single straight line shape and a width of 90 nm is used. If a width of the transferred pattern is to be wider than 86 nm and narrower than 90 nm, the mask pattern is constituted of two partial patterns separated from each other which are obtained by dividing the base pattern widthwise. A distance of the partial patterns can be determined from the first relation.

After the shape and size of a mask pattern are determined, the phase shift mask shown in FIGS. 1A and 1B can be manufactured by well-known methods.

Next, with reference to FIGS. 4A to 4F, description will be made on a method of manufacturing a semiconductor device by using the exposure mask of the first embodiment.

Figure 4A:
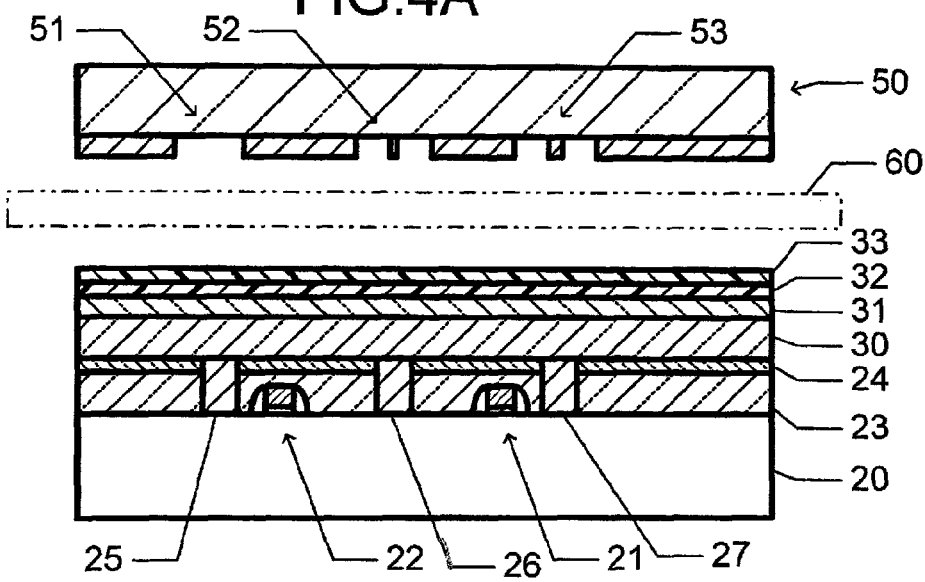
FIG. 4A is a (first) cross sectional view illustrating a semiconductor device during manufacture for describing a semiconductor device manufacture method using the mask of the first embodiment.

As shown in FIG. 4A, on the surface of a semiconductor substrate 20 made of silicon, MOS transistors 21 and 22 are formed. Although not shown in FIG. 4A, an isolation insulating film is formed in a surface layer of the semiconductor substrate 20 by shallow trench isolation (STI) or the like. In the surface layer of an active region, source/drain regions of the MOS transistors 21 and 22 are formed.

An interlayer insulating film 23 of SiOC or the like and a cap film 24 of SiN or the like are formed on the semiconductor substrate 20. For example, these films can be formed by chemical vapor deposition (CVD). Via holes are formed through these two layers, and the via holes are filled with a conductive plug. The conductive plugs 25, 26 and 27 are connected to the source/drain regions of the MOS transistors 21 and 22.

An interlayer insulating film 30 made of SiOC and having a thickness of 300 nm is formed on the cap film 24. A cap film 31 made of SiN and having a thickness of 150 nm is formed on the interlayer insulating film 30. An antireflection film 32 made of novolak resin or the like is formed on the cap film 31, and a photosensitive film 33 made of positive type chemically amplified resist is formed on the antireflection film 32. Thicknesses of the antireflection film 32 and photosensitive film 33 are 80 nm and 250 nm, respectively.

An exposure mask has mask patterns 51 to 53 formed thereon. The mask pattern 51 has a single straight line shape, like the mask pattern 3 shown in FIGS. 1A and 1B. Each of mask patterns 52 and 53 is constituted of separated two partial patterns, like the mask patterns 4 and 5 shown in FIGS. 1A and 1B. A width of the mask pattern 51 is 90 nm for example. A width of each of the partial patterns of the mask patterns 52 and 53 is 45 nm, and distances between the partial patterns of the mask patterns 52 and 53 are 3 nm and 6 nm, respectively.

The photosensitive film 33 is exposed through the exposure mask 50. A reduction projection optical system 60 is disposed between the mask 50 and the semiconductor substrate 20 formed with the photosensitive film 33. In actual, the mask patterns 51 to 53 on the exposure mask 50 are transferred to the photosensitive film 33 at a reduction factor of ¼. However, in FIG. 4A, for the purposes of easy understanding, the mask patterns 51 to 53 are reduced in size by ¼ and are shown based on reduced sizes. The photosensitive film 33 is exposed through the exposure mask 50.

Figure 4B:
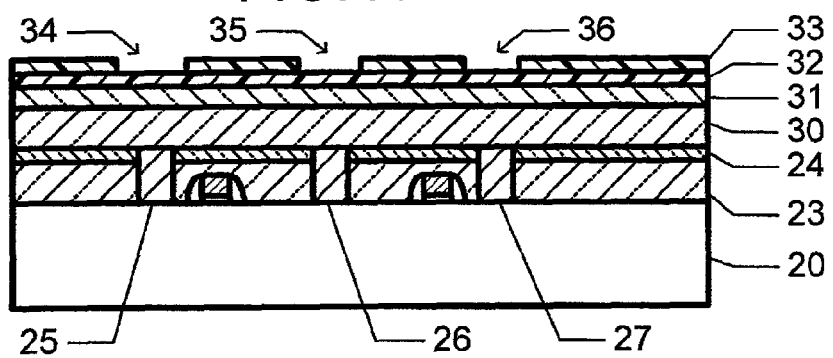
FIG. 4B is a (second) cross sectional view illustrating a semiconductor device during manufacture for describing a semiconductor device manufacture method using the mask of the first embodiment.

As shown in FIG. 4B, the exposed photosensitive film 33 is developed. Openings 34 to 36 transferred from the mask patterns 51 to 53 are therefore formed through the photosensitive film 33. The openings 34 to 36 correspond to wiring trenches to be formed through the interlayer insulating film 30. Widths of the openings 34 to 36 are 90 nm, 88 nm and 86 nm, respectively.

Figure 4C:
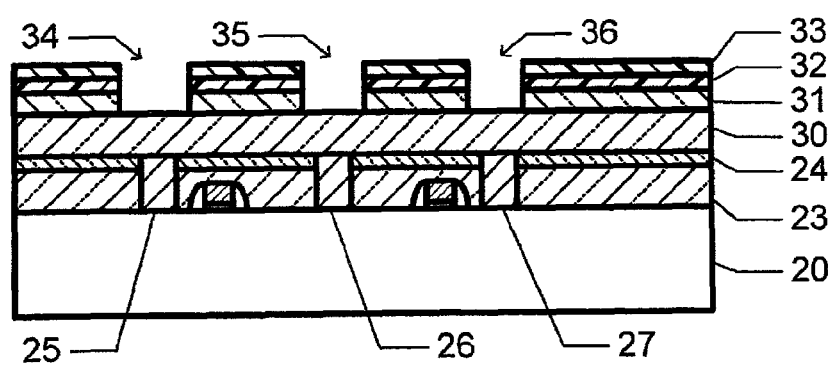
FIG. 4C is a (third) cross sectional view illustrating a semiconductor device during manufacture for describing a semiconductor device manufacture method using the mask of the first embodiment.
Figure 4D:
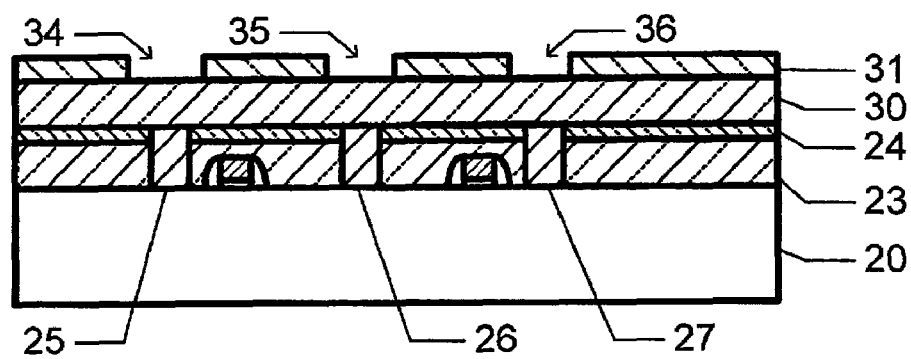
FIG. 4D is a (fourth) cross sectional view illustrating a semiconductor device during manufacture for describing a semiconductor device manufacture method using the mask of the first embodiment.

As shown in FIG. 4C, by using the photosensitive film 33 as an etching mask, the antireflection film 32 and cap film 31 are etched via the openings 34 to 36. Openings 34 to 36 corresponding to the wiring trenches are therefore formed through the cap film 31. The antireflection film 32 is etched by using fluorocarbon as etching gas, and the cap film 31 is etched by using mixture gas of fluorocarbon and oxygen as etching gas. As shown in FIG. 4D, the photosensitive film 33 and antireflection film 32 are removed by ashing by using oxygen, mixture gas of oxygen, nitrogen and argon, or other gas.

Figure 4E:
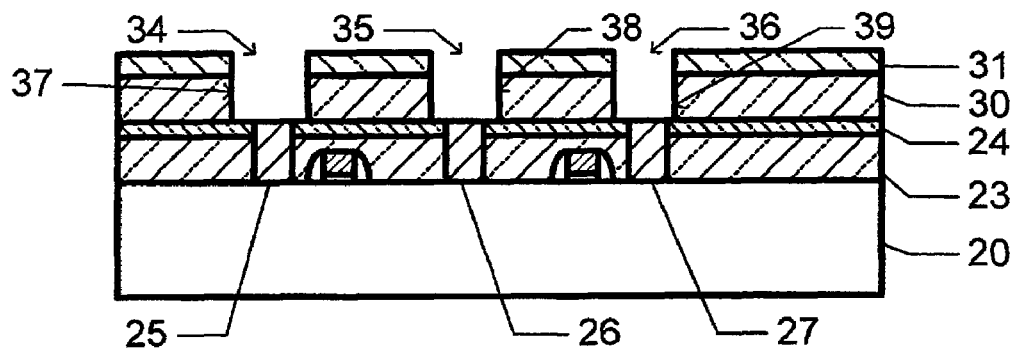
FIG. 4E is a (fifth) cross sectional view illustrating a semiconductor device during manufacture for describing a semiconductor device manufacture method using the mask of the first embodiment.

As shown in FIG. 4E, by using the cap film 31 as an etching mask, the interlayer insulating film 30 is etched by using etching gas of fluorocarbon added with oxygen and carbon monoxide. Wiring trenches 37 to 39 corresponding to the openings 34 to 36 are therefore formed. The upper surfaces of the conductive plugs 25 to 27 are exposed on the bottoms of the wiring trenches 37 to 39.

Figure 4F:
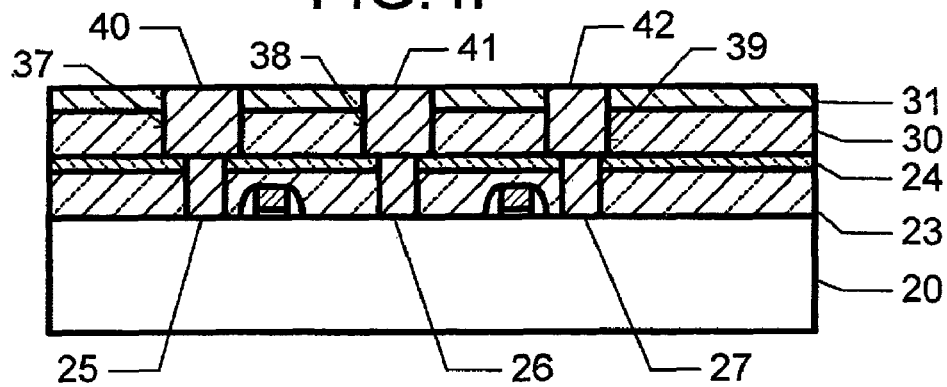
FIG. 4F is a (sixth) cross sectional view illustrating a semiconductor device during manufacture for describing a semiconductor device manufacture method using the mask of the first embodiment.

As shown in FIG. 4F, the wiring trenches 37 to 39 are filled with copper wirings 40 to 42, respectively. The wiring trenches have the widths of 90 nm, 88 nm and 86 nm, respectively. Each of the mask patterns 52 and 53 shown in FIG. 4A is constituted of two partial patterns, base patterns of which have the same pattern as the mask pattern 51. The sizes in a width direction of the transferred patterns corresponding to the mask patterns 52 and 53 are smaller than the size in a width direction of the transferred pattern corresponding to the mask pattern 51 same as the base pattern.

A transferred pattern having a smaller size in a direction spacing the partial patterns can be formed by using a mask pattern constituted of two partial patterns, than by using as a mask pattern the base pattern itself.

Copper wirings are formed by a damascene method in FIGS. 4A to 4F. The exposure mask of the first embodiment may be applied to other patterns such as a gate pattern of a MOS transistor. In forming a gate pattern, a polysilicon film is formed on the whole surface of a substrate, and an antireflection film and a photosensitive film are formed on the polysilicon film. A mask pattern in which the light shielding area and light transmitting areas of the mask patterns 3 to 5 shown in FIGS. 1A and 1B are reversed is used when the gate pattern is formed. In this manner, a pattern of the photosensitive film can remain in an area corresponding to the gate pattern.

By using the exposure mask of the first embodiment, the gate length can be adjusted finely.

FIGS. 5A to 5I show mask patterns according to modifications of the first embodiment. As shown in FIG. 5A, a mask pattern may be constituted of three partial patterns, into which a base pattern having an elongate rectangular shape is divided in a width direction. A distance between adjacent partial patterns is narrower than the resolution limit.

As shown in FIG. 5B, a coupling portion coupling two partial patterns with each other may be formed. If the size of the coupling portion is sufficiently small as compared to a length of the partial pattern, the influence of the coupling portion upon the shape and size of a transferred pattern can be neglected. As shown in FIG. 5C, a base pattern may be divided into two partial patterns by cutting the base pattern along one diagonal line, and the two partial patterns are spaced from each other by a distance narrower than the resolution limit. As shown in FIG. 5D, the two partial patterns shown in FIG. 5C may be coupled with each other by a coupling portion.

As shown in FIG. 5E, a base pattern may be divided into four partial patterns by cutting the base pattern along two diagonal lines, and two adjacent partial patterns are spaced from each other by a distance narrower than the resolution limit. As shown in FIG. 5F, a base pattern may be divided into three partial patterns by cutting the base pattern along two straight lines roughly parallel to one diagonal line, and three partial patterns are spaced from each other by a distance narrower than the resolution limit. A hammer head may be formed to a base pattern to suppress shortening.

FIGS. 5G to 5I are plan views of mask patterns for a base pattern having a vertical to horizontal ratio of near 1, e.g., having a shape near a square. A mask pattern shown in FIG. 5G is constituted of four partial patterns formed by dividing the base pattern equally in vertical and horizontal directions. A distance between adjacent two partial patterns is narrower than the resolution limit. As shown in FIG. 5H, adjacent partial patterns shown in FIG. 5G may be coupled with each other by a coupling portion.

As shown in FIG. 5I, a base pattern may be divided into four partial patterns by cutting the base pattern along two diagonal lines. Also in this case, a distance between adjacent two partial patterns is narrower than the resolution limit.

The patterns shown in FIGS. 5G to 5I are applied to patterns of via holes or the like. If a vertical to horizontal ratio or a horizontal to vertical ratio of a base pattern is in a range between 1:1 and 1:3, a base pattern may be divided in two vertical and horizontal directions.

Next, with reference to FIGS. 6A to 6D, a mask pattern of the second embodiment will be described.

FIG. 6A is a plan view of a mask pattern 70 of the second embodiment. In the second embodiment, an auxiliary pattern 71 is formed in the mask pattern 70. An outside area of the mask pattern 70 and an inside area of the auxiliary pattern 71 are light shielding areas. The light shielding film 2 made of MoSi shown in FIG. 1B is formed in the light shielding area. An ultraviolet ray using ArF excimer laser as a light source transmits almost 100% in an area inside the mask pattern 70 and outside the auxiliary pattern 71.

The mask pattern 70 has an elongated rectangular outer shape, for example, a length L of 1000 nm and a width of 106 nm. The auxiliary pattern 71 is disposed along a center line of the mask pattern 70 in the longitudinal direction, and has an shape elongated along the center line. A size of the auxiliary pattern 71 is shorter than the resolution limit. The auxiliary pattern 71 is constituted of an elongated rectangular main portion 71A and narrow portions 71B of a rectangular shape, each of the narrow portions 71B protruding from a center of each shorter side of the main portion 71A.

A length LM of the main portion 71A is 760 nm and a width WA is 10 nm. A length LP of each narrow portion 71B is 60 nm and a width WP is 4 nm. The auxiliary pattern 71 is disposed centrally in the mask pattern 70 both in the longitudinal and width directions. Namely, a distance from the front end of the narrow portion 71B to the shorter side of the mask pattern 70 is 60 nm, and a distance from the longer side of the main portion 71A to a corresponding longer side of the mask pattern 70 is 48 nm. A step of the coupling portion between the main and narrow portions 71A and 71B is 3 nm.

These sizes are calculated by a correction method called simulation base OPC to set the width of the transferred pattern to 90 nm and suppress shortening.

The mask pattern 70 includes therein the opening (auxiliary pattern) having an opening width not wider than the design rule, and the inside of the opening being the light shielding area. The "light shielding area" is intended not only an area which shields exposure light 100% but also a relatively low transmission rate area in a case where a transmission area and a semi-transmission area are formed like a half tone phase shift mask.

FIG. 6B shows an example of a mask pattern 80 having conventional hammer heads. The mask pattern 80 is constituted of an elongated rectangular main portion 80A, a first-stage hammer head portion 80B and a second-stage hammer head portion 80C protruding from positions near both ends of the longer sides of the main portion toward in a width direction. A length L1 of the main portion 80A is 1000 nm and a width W1 is 90 nm.

The second-stage hammer head portion 80C is disposed in an area having a length LH inclusive of the end point of the longer side of the main portion 80A. The first-stage hammer head portion 80B is disposed in an area having a length LH continuous with the area where the second-stage hammer portion 80C is disposed. The length LH is 60 nm. A size WH1 in the width direction of the first-stage hammer head portion 80B is 6 nm, and a size WH2 in the width direction of the second-stage hammer head portion 80C is 12 nm. Namely, a step at the coupling portion between the first-stage and second-stage hammer head portions 80B and 80C is 6 nm. These sizes are also calculated by the correction method called simulation base OPC to set the width of the transferred pattern to 90 nm and suppress shortening.

FIGS. 6C and 6D show a transferred pattern formed by the mask pattern 70 of the second embodiment shown in FIG. 6A and a transferred pattern formed by the conventional mask pattern 80 shown in FIG. 6B. These transferred patterns are obtained through simulation. An exposure wavelength used for the simulation is 193 nm same as the wavelength of ArF excimer laser. Also in the second embodiment, it can be seen that it is possible to form a pattern of good quality as good as that formed by using the mask pattern having the conventional hammer heads.

In the mask pattern 70 of the second embodiment shown in FIG. 6A, a total width of the transmission area in the range where the main portion 71A is disposed is 96 nm, a total width of the transmission area in the range where the narrow portion 71B is disposed is 102 nm, and a total width of the transmission area in the range where the auxiliary pattern 71 is not disposed is 106 nm. The transmission area has three widths. It can therefore be considered that the mask pattern 70 has the deformation suppressing effect of the transferred pattern shape, to the same degree to that of the mask pattern 80 shown in FIG. 6B formed with the two-stage hammer head portions.

The outer shape of the mask pattern 70 of the second embodiment shown in FIG. 6A has four apexes, and the auxiliary pattern 71 has twelve apexes. Namely, there are sixteen apexes in total. In contract, the conventional hammer head type mask pattern 80 shown in FIG. 6B has twenty apexes. The mask pattern 70 of the second embodiment can reduce the design data volume of a mask pattern without degrading the quality of a transferred pattern shape, compared to the mask pattern 80 using the conventional hammer heads.

Next, with reference to FIGS. 7A to 7D, a mask pattern of the third embodiment will be described.

Figure 7A:
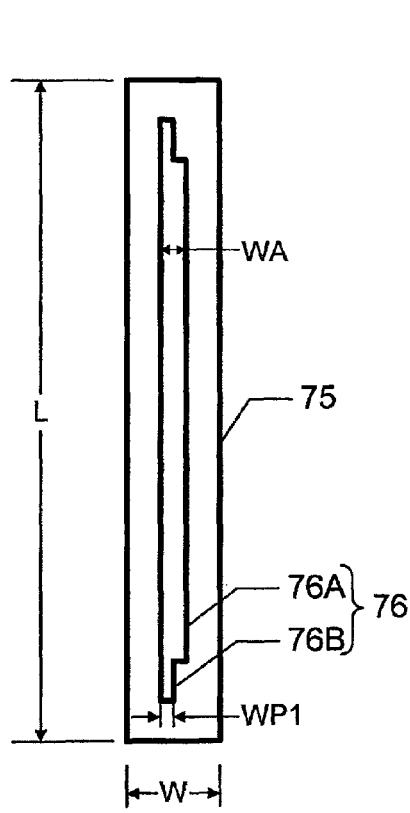
FIG. 7A is a plan view of a mask pattern of a third embodiment.

FIG. 7A is a plan view of a mask pattern 75 of the third embodiment. Description will now be made by paying attention to different points from the mask pattern 70 of the second embodiment shown in FIG. 6A. In the third embodiment, instead of the auxiliary pattern 71 of the second embodiment, an auxiliary pattern 76 is used which has a shape different from that of the auxiliary pattern 71.

Although the auxiliary pattern 71 of the second embodiment has the narrow portions 71B protruding from the centers of the shorter sides of the main portion 71A, in the third embodiment, narrow portions 76B are shifted to ends of the shorter sides of a main portion 76A, one longer side of each narrow portion 76B and one longer side of the main portion 76A forming one straight line. Namely, one edge of the auxiliary pattern 76 along the longitudinal direction is constituted of one straight line from one end to the other end, and the other edge is stepwise. Therefore, the number of apexes is smaller by four than that of the second embodiment.

The outer size and shape of the mask pattern 75 are the same as those of the mask pattern 70 of the second embodiment. The length and width of the main portion 76A of the auxiliary pattern 76 of the third embodiment are the same as those of the main portion 71A of the auxiliary portion 71 of the second embodiment. A length of the narrow portion 76B of the auxiliary pattern 76 of the third embodiment is the same as that of the narrow portion 71B of the auxiliary pattern 71 of the second embodiment, and a width WP1 thereof is wider by 5 nm than that of the narrow portion 71B of the auxiliary pattern 71 of the second embodiment.

Figure 7B:
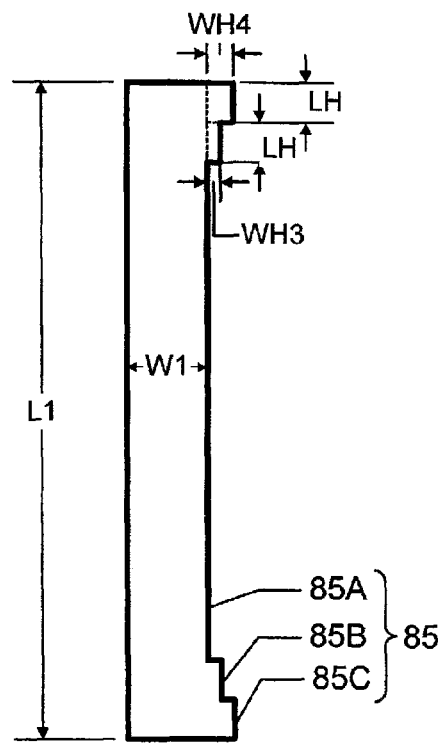
FIG. 7B is a plan view of a modification of a conventional hammer head type mask pattern.

For the sake of reference, a plan view of a mask pattern 85 is shown in FIG. 7B, the mask pattern having hammer head portions 7B formed only on one side. The length and width of a main portion 85A are the same as those of the main portion 80A of the mask pattern 80 shown in FIG. 6B. A size LH of first- and second-stage hammer head portions 85B and 85C along a longitudinal direction of the main portion 85A is the same as that of the first- and second-stage portions 80B and 80C shown in FIG. 6B. Sizes WH3 and WH4 in a width direction of the first- and second-stage hammer head portions 85B and 85C are 6 nm and 18 nm, respectively. Namely, a step between the first- and second-stage hammer head portions 85B and 85C is 12 nm.

Figure 7C:
FIGS. 7C and 7D are plan views of the patterns formed by transferring the mask patterns shown in FIGS. 7A and 7B.
Figure 7D:
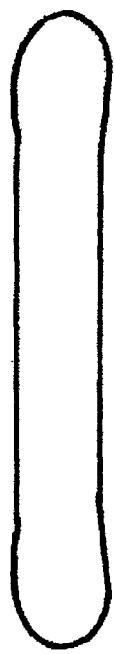

FIGS. 7C and 7D show simulation results of the transferred patterns formed by the mask patterns 75 and 85 shown in FIGS. 7A and 7B. The ends of the transferred pattern shown in FIG. 7D are slightly curved because of reflection of the shapes of the first- and second-stage hammer head portions 85B and 85C of the mask pattern 85 shown in FIG. 7B. In contrast, the transferred pattern shown in FIG. 7C is by no means inferior to the transferred patterns shown in FIGS. 6C and 6D.

In the third embodiment, an amount of pattern design data can be reduced by reducing the number of apexes by making the auxiliary pattern 75 asymmetric to the center axis of the outer shape of the mask pattern 75. In this case, the shape of the transferred pattern maintains the quality equal to that of the shape of the transferred pattern corresponding to the mask pattern 70 shown in FIG. 6A.

In the second embodiment, as shown in FIG. 6A, the outer shape of the mask pattern 70 is made rectangular and the number of apexes of the auxiliary pattern 71 is set to "12". In the third embodiment, as shown in FIG. 7A, the outer shape of the mask pattern 75 is made rectangular, and the number of apexes of the auxiliary pattern 76 is set to "8". By making the outer shape of the mask pattern 75 be a polygon having the smaller number of apexes than that of the auxiliary pattern, the design data volume can be reduced compared to the case where the hammer head portions are formed, while maintaining quality of the shape of the transferred pattern.

By setting the number of apexes of the auxiliary pattern to at least "8", the shape and size of the transferred pattern can be maintained to the same degree as the shape and size of the transferred pattern formed by the mask pattern having two-stage hammer head portions, like the third embodiment shown in FIGS. 7A and 7C. The two-stage structure may be adopted only at one end of the auxiliary pattern. In this case, the number of apexes of the auxiliary pattern is "6".

In the second and third embodiments, although the outer shape of each mask pattern is an elongated rectangle, the shape is not limited to the rectangle, but any shape elongated along one direction and having a uniform width may also be used. The auxiliary pattern may have a shape elongated in the same direction as the longitudinal direction of the outer shape and having a narrow portion narrower than the central portion at least at one end.

In the first to third embodiments, although the mask pattern is applied to a half tone phase shift mask, the mask pattern may be applied to other masks, with the same expected advantages. For example, in the mask pattern 70 of the second embodiment shown in FIG. 6A, a light transmission rate of the mask pattern is more generally set in such a manner that a light transmission rate of an area inside the mask pattern 70 and outside the auxiliary pattern 71 is lower or higher than both the light transmission rate of an area inside the auxiliary pattern 71 and the light transmission rate of an area outside the mask pattern 70.

The mask pattern of the embodiments described above is used preferably for the area where ends of two rectangular patterns are protruded and a narrow space is defined between the patterns, an in the case of the SRAM cell layout structure of a semiconductor device. By using the mask pattern of the embodiments, it becomes possible to improve reproductivity of processing a pattern which is so fine that a nonlinear behavior is exhibited when the proximity effect correction is performed.

The present invention has been described in connection with the preferred embodiments. The invention is not limited only to the above embodiments. It will be apparent to those skilled in the art that other various modifications, improvements, combinations, and the like can be made.

What I claim is:

1. A manufacture method for an exposure mask, comprising:

(a) forming a mask pattern having a shape that a base pattern is divided into at least two partial patterns disposed at a space narrower than a resolution limit, and acquiring a first relation between a width of the space separating the partial patterns and a size of a pattern on a substrate formed by transferring the mask pattern;

(b) determining the width of the space separating the partial patterns in accordance with the size of a pattern to be formed on the substrate and the first relation; and (c) forming a mask pattern having at least two separated partial patterns on a mask in accordance with the width of the space determined at the step (b).

2. The manufacture method for an exposure mask according to claim 1, wherein the mask pattern to be transferred has a shape elongated in one direction, and the mask pattern is divided in a width direction of the mask pattern in the step (a).

3. The manufacture method for an exposure mask according to claim 1, wherein the mask pattern to be formed at the step (c) has a coupling portion coupling the separated two partial patterns with each other.

4. An exposure mask comprising:
a mask substrate; and
a mask pattern formed on the mask substrate,
wherein the mask pattern includes at least two partial patterns corresponding to a pattern to be transferred to a substrate and separated from each other at a space narrower than a resolution limit.

5. A pattern transfer method comprising:
(a) exposing a photosensitive film through an exposure mask having a mask pattern of a shape that a base pattern is divided in a first direction into at least two partial patterns disposed at a space narrower than a resolution limit; and
(b) and developing the exposed photosensitive film to form a first pattern to which the mask pattern is transferred, wherein a size in the first direction of the first pattern is smaller than a size in the first direction of a second pattern formed by transferring the base pattern under a same exposure condition as a condition of the step (a).

6. The pattern transfer method according to claim 5, wherein a total sum of sizes in the first direction of the partial patterns constituting the mask pattern is equal to a size in the first direction of the base pattern.

7. An exposure mask comprising:
a mask substrate; and
a mask pattern including therein an auxiliary pattern and formed on the mask substrate,
wherein a light transmission rate of an area inside the mask pattern and outside the auxiliary pattern is lower or higher than both a light transmission rate of an area inside the auxiliary pattern and a light transmission rate of an area outside the mask pattern, an outer shape of the mask pattern is a polygon having the number of apexes smaller than the number of apexes of the auxiliary pattern, and a size of the auxiliary pattern is smaller than a resolution limit.

8. The exposure mask according to claim 7, wherein the number of apexes of the auxiliary pattern is at least six.

9. The exposure mask according to claim 7, wherein the mask pattern has a shape elongated in a first direction and having an uniform width, the auxiliary pattern has also a shape elongated in the first direction, and the auxiliary pattern includes a narrow portion narrower than a width in a central area, at least at one end of the auxiliary pattern.

10. The exposure mask according to claim 9, wherein the one edge of the auxiliary pattern in a longitudinal direction is constituted of one straight line from one end to the other end and the other edge is in a step-wise pattern.

11. A pattern transfer method comprising:
exposing a photosensitive film through a mask pattern including therein an auxiliary pattern, wherein a light transmission rate of an area inside the mask pattern and outside the auxiliary pattern is lower or higher than both a light transmission rate of an area inside the auxiliary pattern and a light transmission rate of an area outside the mask pattern, an outer shape of the mask pattern is a polygon having the number of apexes smaller than the number of apexes of the auxiliary pattern, and a size of the auxiliary pattern is smaller than a resolution limit; and
developing the exposed photosensitive film.

12. The pattern transfer method according to claim 11, wherein the number of apexes of the auxiliary pattern is at least six.

13. The pattern transfer method according to claim 11, wherein the mask pattern has a shape elongated in a first direction and having a uniform width, the auxiliary pattern has also a shape elongated in the first direction, and the auxiliary pattern includes a narrow portion narrower than a width in a central area, at least at one end of the auxiliary pattern.

14. The pattern transfer method according to claim 13, wherein the one edge of the auxiliary pattern in a longitudinal direction is constituted of one straight line from one end to the other end and the other edge is in a step-wise pattern.

15. A pattern forming method comprising:
exposing a photosensitive film on a semiconductor wafer through a mask pattern having an opening whose width is not wider than a width of a design rule, an area inside the opening being a light shielding area; and
developing the exposed photosensitive film to form a pattern on the semiconductor wafer.

16. A manufacture method for an SRAM comprising:
exposing a photosensitive film on a semiconductor wafer through a mask pattern having an opening whose width is not wider than a width of a design rule, an area inside the opening being a light shielding area;
developing the exposed photosensitive film to form a pattern on the semiconductor wafer; and
by using the pattern as a mask, processing a surface layer of the semiconductor wafer.

* * * * *